US011776600B2

(12) United States Patent
Pohlmann et al.

(10) Patent No.: US 11,776,600 B2
(45) Date of Patent: Oct. 3, 2023

(54) MEMORY CLOCK MANAGEMENT AND ESTIMATION PROCEDURES

(71) Applicant: Micron Technology, Inc., Boise, ID (US)

(72) Inventors: Erik V. Pohlmann, Boise, ID (US); Neal J. Koyle, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 17/649,006

(22) Filed: Jan. 26, 2022

(65) Prior Publication Data
US 2022/0246188 A1 Aug. 4, 2022

Related U.S. Application Data

(60) Provisional application No. 63/145,359, filed on Feb. 3, 2021.

(51) Int. Cl.
*G11C 7/22* (2006.01)
*G11C 8/18* (2006.01)
*G11C 7/10* (2006.01)

(52) U.S. Cl.
CPC ............ *G11C 7/222* (2013.01); *G11C 7/1069* (2013.01); *G11C 7/1096* (2013.01); *G11C 8/18* (2013.01)

(58) Field of Classification Search
CPC ..... G11C 7/222; G11C 7/1069; G11C 7/1096; G11C 8/18
USPC ...................................................... 365/233.1
See application file for complete search history.

(56) References Cited

U.S. PATENT DOCUMENTS

| 2003/0128573 | A1 | 7/2003 | Hsu et al. |
| 2008/0313589 | A1 | 12/2008 | Maixner et al. |
| 2013/0258795 | A1 | 10/2013 | Wang et al. |
| 2015/0228317 | A1* | 8/2015 | Mazumder ............... G11C 7/22 365/189.08 |
| 2015/0235691 | A1 | 8/2015 | Kwak |
| 2017/0337955 | A1 | 11/2017 | Chen et al. |

OTHER PUBLICATIONS

"International Search Report and Written Opinion of the International Searching Authority," issued in connection with Int'l Appl. No. PCT/US2022/070389, dated May 4, 2022 (9 pages).

* cited by examiner

*Primary Examiner* — Huan Hoang
(74) *Attorney, Agent, or Firm* — Holland & Hart LLP

(57) ABSTRACT

Methods, systems, and devices for memory clock management and estimation procedures are described. A host device may determine a quantity of clock cycles associated with a duration for accessing a memory cell of a memory array based on truncating a value of a first parameter associated with another duration for a clock to perform a clock cycle. The host device may estimate a value of a second parameter related to (e.g., inversely proportional) to the truncated value of the first parameter and related to (e.g., directly proportional) to a correction factor, and may adjust (e.g., truncate) a third parameter to determine the quantity of clock cycles. Additionally or alternatively, the host device may adjust (e.g., perform a ceiling operation on) the second parameter to determine the quantity of clock cycles. The host device may access the memory cell based on the quantity of clock cycles.

25 Claims, 6 Drawing Sheets

MEMORY CLOCK MANAGEMENT AND ESTIMATION PROCEDURES

CROSS REFERENCE

The present application for patent claims the benefit of U.S. Provisional Patent Application No. 63/145,359 by POHLMANN et al., entitled "MEMORY CLOCK MANAGEMENT AND ESTIMATION PROCEDURES," filed Feb. 3, 2021, assigned to the assignee hereof, and expressly incorporated by reference herein.

FIELD OF TECHNOLOGY

The following relates generally to one or more systems for memory and more specifically to memory clock management and estimation procedures.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A host device may perform operations using a clock that repeats according to a clock cycle. For instance, the host device may identify a duration associated with accessing one or more memory cells of a memory array of a memory device (e.g., a write recovery delay, a row address to column address delay) and may determine a quantity of clock cycles equivalent in time to the duration. If the host device quantizes (e.g., truncates) a value of the clock cycle, however, the quantity of clock cycles may not be equivalent in time to the identified duration.

Accordingly, the host device may attempt to determine (e.g., estimate) the quantity of clock cycles that is closest in time to the identified duration. One method by which the host device may attempt to do so may include the host device determining the quantity of clock cycles by determining a ratio inversely proportional to the quantized value of the clock cycle and adjusting the ratio (e.g., by adding a correction factor to the ratio). There may be instances, however, where such an approach may not yield a quantity of clock cycles closest in time to the identified duration. For instance, the host device may determine a quantity of clock cycles that is one higher than the quantity of clock cycles closest in time to the identified duration due to rounding errors.

The examples herein may describe a method or methods that may enable the host device to more often determine the quantity of clock cycles that is closest in time to the identified duration. For instance, the examples herein may describe a method or methods in which the host device determines the quantity of clock cycles by determining a ratio inversely proportional to the quantized value of the clock cycle and directly proportional to a correction factor. In some examples, the host device may determine the quantity of clock cycles by quantizing (e.g., performing a ceiling operation on) the ratio or may generate a parameter based on combining the ratio and a second correction factor and may truncate the parameter. Determining the quantity of clock cycles in this manner should more often yield the quantity of clock cycles closest in time to the identified duration as opposed to alternative methods, such as determining the quantity of clock cycles by adding a correction factor to a ratio. Accordingly, the methods described herein may enable the host device to more accurately perform a memory access procedure.

Features of the disclosure are initially described in the context of systems as described with reference to FIG. 1. Features of the disclosure are described in the context process flows as described with reference to FIGS. 2-3. These and other features of the disclosure are further illustrated by and described with reference to an apparatus diagram and flowcharts that relate to memory clock management and estimation procedures as described with reference to FIGS. 4-6.

Figure 1:
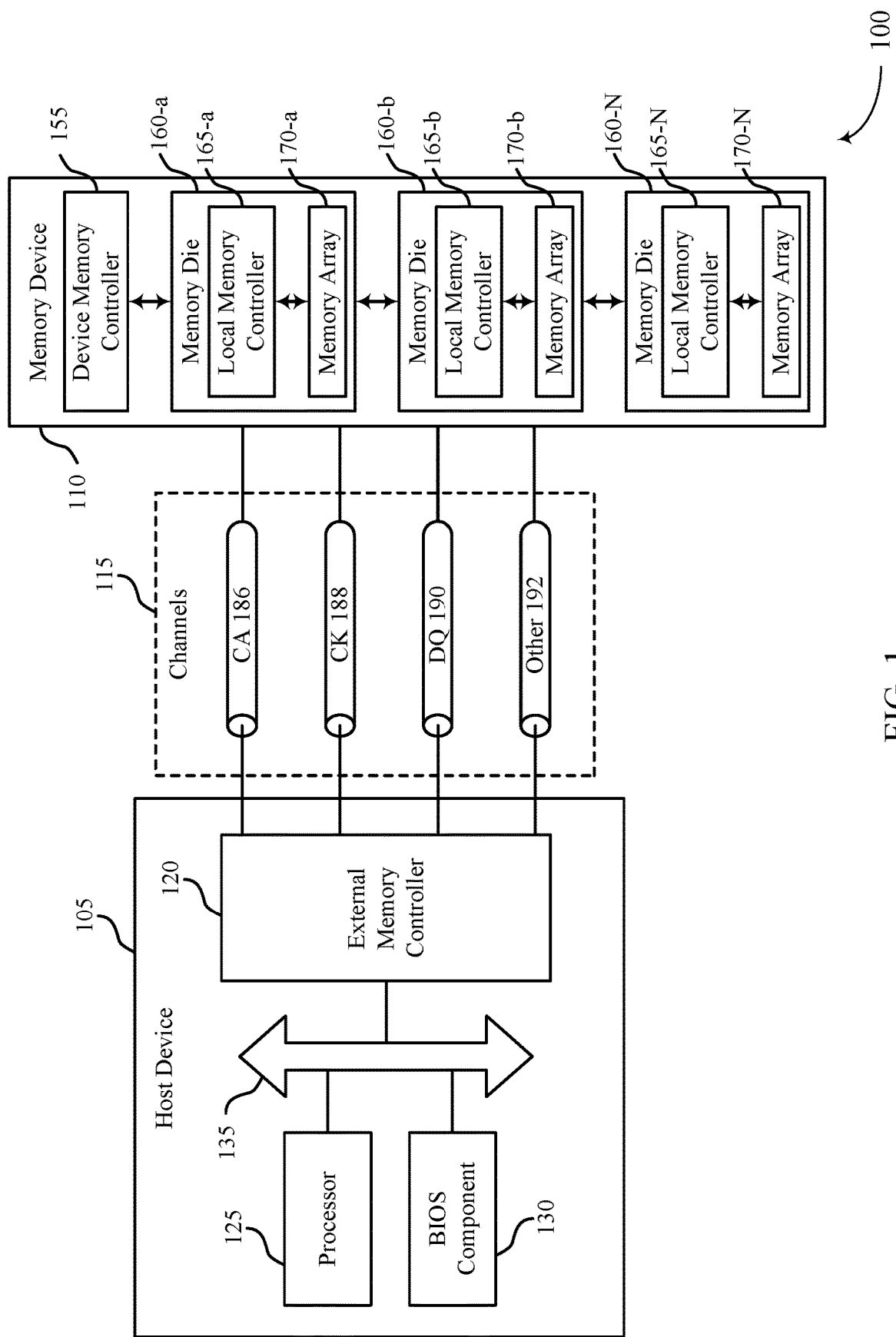
FIG. 1 illustrates an example of a system that supports memory clock management and estimation procedures in accordance with examples as disclosed herein.

FIG. 1 illustrates an example of a system 100 that supports memory clock management and estimation procedures in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface (e.g., a bus, a set of pins) for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, a host device 105 or a memory device 110 may perform operations using a clock that repeats according to a clock cycle. For instance, the host device 105 or memory device 110 may identify a duration associated with accessing one or more memory cells of a memory array 170 (e.g., a write recovery delay, a row address to column address delay) and may determine a quantity of clock cycles equivalent in time to the duration. In some examples, the host device may access (e.g., read, retrieve data from) a register (e.g., a serial presence detect (SPD) register) of the memory device to identify the duration associated with accessing the one or more memory cells of the memory array. Additionally or alternatively, the host device may access memory cells of the memory device to identify the duration. If the host device 105 or the memory device 110 quantizes (e.g., truncate) a value of the clock cycle, however, the quantity of clock cycles may not be equivalent in time to the identified duration.

Accordingly, the host device 105 or memory device 110 may attempt to determine the quantity of clock cycles that is closest in time to the identified duration. One method by which the host device 105 or memory device 110 may attempt to do so may include the memory device 110 determining the quantity of clock cycles by determining a ratio inversely proportional to the quantized value of the clock cycle and adding a correction factor to the ratio. There may be instances, however, where such an approach may not yield a quantity of clock cycles closest in time to the identified duration. For instance, the host device 105 or memory device 110 may determine a quantity of clock cycles that is one higher than the quantity of clock cycles closest in time to the identified duration due to rounding errors.

The examples herein describe a method or methods that may enable the host device 105 or the memory device 110 to more often determine the quantity of clock cycles that is closest in time to the identified duration compared to other different techniques. For instance, the examples herein may describe a method or methods in which the host device 105 or the memory device 110 determines the quantity of clock cycles by determining a ratio inversely proportional to the quantized value of the clock cycle and directly proportional to a correction factor. Determining the quantity of clock cycles in this manner may more often yield the quantity of clock cycles closest in time to the identified duration than other different techniques, such as determining the quantity of clock cycles by determining a ratio inversely proportional to the quantized value of the clock cycle and adding a correction factor to the ratio.

Methods for calculation of timing parameters may be subject to rounding errors from one or more sources. For example, a system (e.g., a host device 105, a memory device 110) may use a memory clock with a particular nominal frequency (e.g., 2200 megahertz or 4400 million transfers per second) for a speed bin, which may mathematically yield a particular clock period (e.g., 0.454545 nanoseconds repeating). In some examples, it is impossible or practically difficult to express each digit after the decimal point exactly and rounding may be used by the host device or the memory device to simplify the method or methods. The timing parameters may, in some examples, have a minimum granularity (e.g., 1 picosecond).

Methods for rounding may be defined to enable improved performance (e.g., optimization of device performance) without violating device parameters (e.g., an industry standard or specification). Each timing parameter may be specified in the time domain (e.g., in nanoseconds, picoseconds), which may then be converted to the clock domain (e.g., nCK units), and may be defined to align with (e.g., follow, use) these methods. The timing parameters (e.g., minimum timing parameters, maximum timing parameters) may use the same or similar rounding methods used to define an application memory clock period (e.g., a minimum application memory clock period such as tCK(AVG)min or a maximum application memory clock period). The resulting rounding methods may rely on results that are within correction factors (e.g., of device testing and/or specification) to avoid losing performance due to rounding errors.

Such rules or methods may include that one or more timing parameter values (e.g., one or more minimum timing parameter values such as tCK(AVG)min or one or more maximum timing parameter values) may be rounded down and defined to a particular granularity (e.g., 1 picosecond) of accuracy based on a non-rounded nominal value, such as a tCK(AVG)min value, for a given speed bin. If the nominal value, such as the nominal timing parameter (e.g., minimum timing parameter, maximum timing parameter) value, is to use more than the particular granularity (e.g., 1 picosecond) of accuracy, the nominal timing parameter value may be rounded down to the next value of the particular granularity (e.g., 1 picosecond) according to the rounding algorithms or methods.

For timing parameters (e.g., minimum timing parameters other than tCK(AVG)min, maximum timing parameters), nominal values of the timing parameters may be reduced by the same or a greater percent reduction (e.g., correction factor) that was used to define the one or more timing parameter (e.g., minimum timing parameter, maximum timing parameter) values, such as tCK(AVG)min. Reducing the nominal values in this manner may enable the host device or the memory device to avoid losing performance due to additional erroneous clock domain values, such as nCK, and may enable the host device or the memory device to calculate more accurate (e.g., true) real values (e.g., real minimum values, real maximum values). For instance, a write recovery duration (e.g., a minimum write recovery duration such as tWRmin or a maximum write recovery duration) may have a nominal value of 30 nanoseconds. However, applying a correction factor, such as a 0.3% correction factor, may enable a more aggressive timing (e.g., 29.910 nanoseconds) to be supported, which may enable the smaller clock domain values, such as nCK values, to be maintained when rounding the one or more timing parameter (e.g., minimum timing parameter, maximum timing parameter) values, such as tCK(AVG)min, down to the next value of a particular granularity (e.g., the next picosecond). In some examples, parameter values defined to be 0 picoseconds may not be reduced by a correction factor, or may not use the rounding methods as described herein, or both, for instance, with reference to FIGS. 2 and/or 3.

In some examples nominal parameters (e.g., nominal minimum parameters, nominal maximum parameters) like tWRmin or a row address to column address delay (e.g., a minimum row address to column address delay such as tRCDmin or a maximum row address to column address delay) may be divided by a real application memory clock period (e.g., tCK(AVG)min) yielding a ratio of clock units (e.g., nCK), which may be reduced by a correction factor (e.g., a 0.3% correction factor applied by multiplying by (100%−0.3%)=99.7%). The result may be rounded up to the next integer quantity of clocks (e.g., clock cycles) In some examples, the nominal parameters (e.g., minimum parameters, maximum parameters) may be programmed in quantities of clocks (e.g., nCK) but expressed in units of time. In some examples, the quantity of clocks (e.g., clock cycles) may be determined as:

$$nCK = \text{ceiling}\left[\frac{\text{parameter\_nominal} * \text{correction\_factor}}{tCK(AVG)\text{real}}\right],$$

where the parameter_nominal may correspond to a nominal parameters (e.g., nominal minimum parameters like tWRmin or tRCDmin or nominal maximum parameters), the correction_factor may correspond to a value of the correction factor (e.g., 1−0.003=0.997), and the tCK(AVG)real may correspond to a real application memory clock period.

Rounding down may, additionally or alternatively, be used to calculate clock domain values, such as nCK values. For instance, a second method may include using scaling, for example by 1000, to enable the use of integer math. The nominal parameter (e.g., nominal minimum parameter or nominal maximum parameter), in picoseconds, may be multiplied by a scaled correction factor (e.g., 1000−3=997) before dividing by the application memory clock period. Adding 1000 to the result may round the result up. Dividing by 1000 after adding 1000 may counteract the scaling effect and may result in a simple integer quantity of clocks (e.g., clock cycles). If the result is equal to an integer (e.g., a whole number), the result may not be rounded down as intended and performance may be lost. To address this, the correction factor may be increased from one value to another value (e.g., from 0.28% to 0.3%). Doing so, in some examples, may account for integer boundary conditions. Additional methods may be used if the nominal timing parameter (e.g., nominal minimum timing parameter, nominal maximum timing parameter) value is defined as 0 picoseconds. In some examples, the quantity of clocks (e.g., a minimum quantity of clock cycles) may be determined as:

$$nCK = \text{truncate}\left[\frac{\left(\frac{\text{truncate}(\text{parameter\_nominal\_in\_ps}) * \text{correction\_factor}}{\text{truncate}(tCK(AVG)\text{real\_in\_ps})}\right) + 1000}{1000}\right],$$

where the parameter_nominal_in_ps may correspond to a nominal parameters (e.g., nominal minimum parameters like tWRmin or tRCDmin in units of picoseconds or nominal maximum parameters in units of picoseconds), the correction_factor may correspond to a value of the correction factor (e.g., 997), and the tCK(AVG)real_in_ps may correspond to a real application memory clock period in units of picoseconds.

A host device 105 or a memory device 110 implementing the methods as described herein may be associated with one or more advantages. For instance, determining a quantity of clock cycles based on a ratio directly proportional to a correction factor may more often yield the quantity of clock cycles closest in time to a desired duration than determining the quantity of clock cycles based on a ratio that is not proportional to a correction factor. Accordingly, a host device 105 or a memory device 110 determining the quantity of clock cycles based on the ratio directly proportional to the correction factor may more accurately perform a memory access procedure over a host device 105 or a memory device 110 that determines the quantity of clock cycles based on a ratio that is not proportional to the correction factor. Additional details about implementing the methods described herein may be described with reference to FIGS. 2 and 3.

Figure 2:
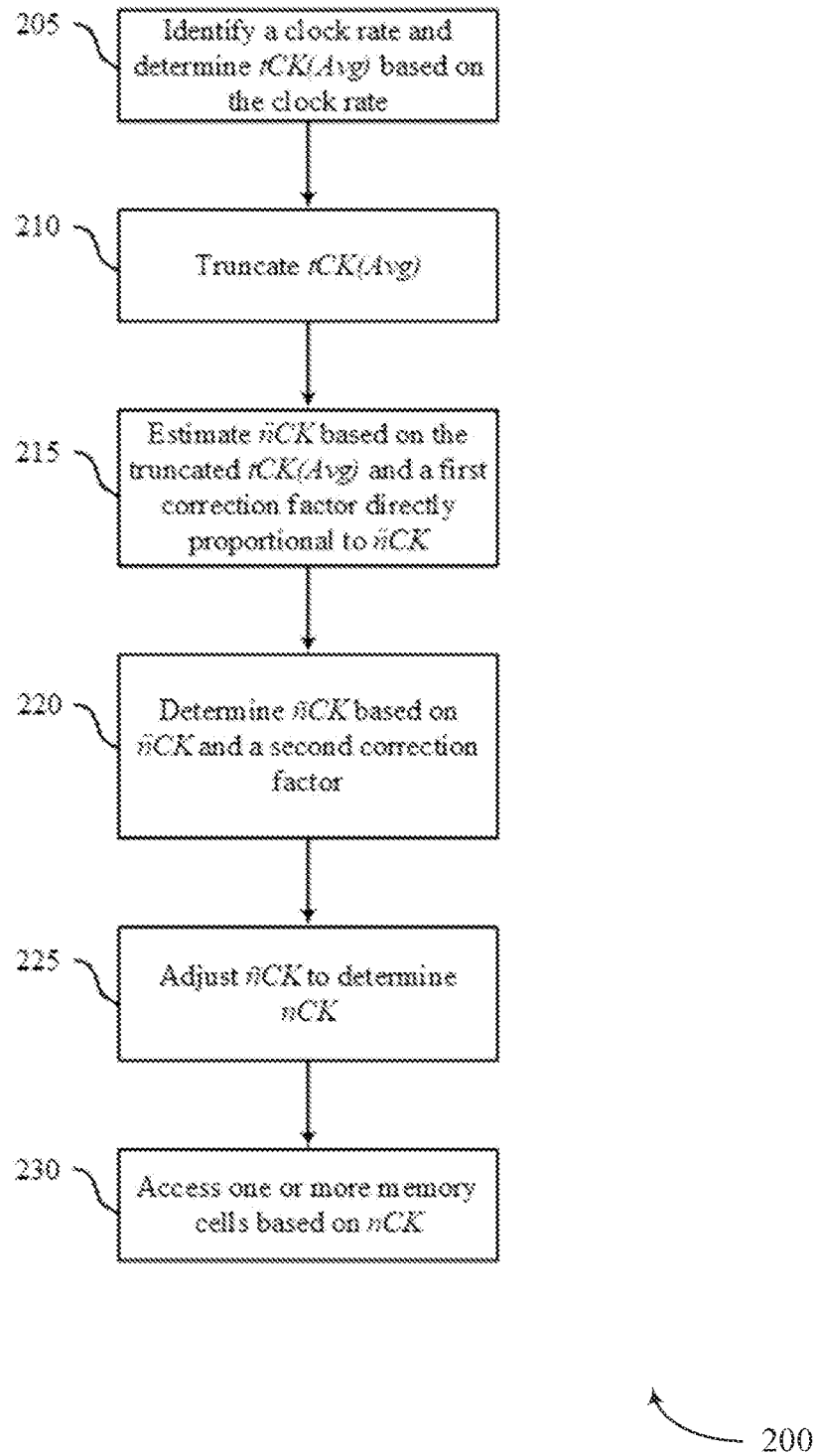
FIG. 2 illustrates an example of a process flow that supports memory clock management and estimation procedures in accordance with examples as disclosed herein.

FIG. 2 illustrates an example of a process flow 200 that supports memory clock management and estimation procedures in accordance with examples as disclosed herein. In some examples, one or more components may perform various aspects of the process flow 200. For instance, an external memory controller (e.g., an external memory controller 120 of a host device 105 as described with reference to FIG. 1), a device memory controller (e.g., a device memory controller 155 as described with reference to FIG. 1) of the memory device, a local memory controller (e.g., a local memory controller 165 as described with reference to FIG. 1), or a combination thereof may perform the methods associated with process flow 200.

As described herein (e.g., with reference to FIG. 1), a host device or a memory device may perform operations using a clock that repeats according to a clock cycle. For instance, the host device or the memory device may identify a duration (e.g., as stored on an SPD of the memory device) associated with accessing one or more memory cells of a memory array (e.g., a write recovery delay, a row address to column address delay) and may determine a quantity of clock cycles that corresponds to the identified duration. The methods as described herein (e.g., with reference to FIG. 2) may enable a host device or a memory device to determine the quantity of clock cycles that corresponds to the identified duration.

At 205, the host device or the memory device may identify (e.g., select) a clock rate (e.g., a clock rate of the host device that is compatible with a clock rate indicated by a register, such as an SPD, or one or more memory cells of the memory device) and may determine the value of a first parameter associated with a first duration for a clock to perform a clock cycle (e.g., tCK(AVG)real_in_ps, which may be an example of a real application memory clock period) based on the clock rate. For instance, the value of the first parameter may be an inverse of a value of the clock rate. In some examples, the host device or the memory device may identify the clock rate based on receiving a request (e.g., from a host device) to adjust to the clock rate. Additionally or alternatively, the host device or the memory device may identify a condition at the host device or the memory device and may adjust the clock rate based on the condition.

At 210, the host device or the memory device may truncate the value of the first parameter. For instance, the host device or the memory device may perform truncate (tCK(AVG)real_in_ps). In some examples, the host device or the memory device may truncate the first parameter to a particular granularity (e.g., to the picosecond level).

At 215, the host device or the memory device may estimate a value of a second parameter (e.g., ñCK) based on the truncated value of the first parameter (e.g., truncate(tCK (AVG)real_in_ps)) and a first correction factor (e.g., correction_factor). For instance, the second parameter may be inversely proportional to the truncated value of the first parameter and directly proportional the first correction factor. In some examples, the second parameter may be directly proportional to a third parameter (e.g., truncate (parameter_nominal_in_ps)) associated with accessing the one or more memory cells of the memory array. In some examples, the third parameter may be determined based on truncating a fourth parameter (e.g., parameter_nominal_in_ps). The second parameter may be determined as:

$$ñCK = \frac{\text{truncate(parameter\_nominal\_in\_ps)} * \text{correction\_factor}}{\text{truncate}(tCK(AVG)\text{real\_in\_ps})}.$$

In some examples, the correction factor may include or be an example of a factor by which the second parameter is corrected. In some examples, for a write recovery delay, parameter_nominal_in_ps may equal 30000 picoseconds and, for a column to column command delay (e.g., tCCD), parameter_nominal_in_ps may equal 5000 picoseconds. In some examples, correction_factor may be equal to 997. In some examples, parameter_nominal_in_ps and tCK(AVG) real_in_ps may not be truncated prior to determination of the second parameter (e.g., ñCK).

At 220, the host device or the memory device may determine a fifth parameter (e.g., ñCK) based on the second parameter (e.g., ñCK) and a second correction factor (e.g., 1000). For instance, the host device or the memory device may combine the second parameter and the second correction factor. The host device or the memory device may determine the fifth parameter as:

$$ñCK = \frac{ñCK + 1000}{1000}.$$

At 225, the host device or the memory device may determine a quantity of clock cycles (e.g., nCK) associated with a second duration for accessing one or more memory cells of the memory array based on adjusting the third parameter. For instance, the host device or the memory device may adjust, based on estimating the value of the second parameter, the third parameter from a first value to a second value lower than the first value. Additionally or alternatively, the host device or the memory device may truncate the first value of the third parameter based on estimating the value of the second parameter. The host device or the memory device may determine the quantity of clock cycles as: nCK=truncate(ñCK). In some examples, the second duration may correspond to a write recovery delay (e.g., tWRmin) or a row address to column address delay (e.g., tRCDmin).

At 230, the host device or the memory device may access the one or more memory cells of the memory array based on the determined quantity of clock cycles. For instance, the host device or the memory device may employ a delay (e.g., tWRmin, tRCDmin) while performing an access operation, such as a read, a write, an activate, or a precharge, on the one or more cells according to the determined quantity of clock cycles.

A host device or a memory device implementing the methods as described herein (e.g., with reference to FIG. 2) may be associated with one or more advantages. For instance, determining a quantity of clock cycles based on a ratio directly proportional to a correction factor may more often yield the quantity of clock cycles closest in time to a desired duration than determining the quantity of clock cycles based on a ratio that is not proportional to a correction factor. Accordingly, a host device or a memory device determining the quantity of clock cycles based on the ratio directly proportional to the correction factor may more accurately perform a memory access procedure over a host device or a memory device that determines the quantity of clock cycles based on a ratio that is not proportional to the correction factor.

An additional or alternative method for determining a quantity of clock cycles according to the methods described herein may be described with reference to FIG. 3.

Figure 3:
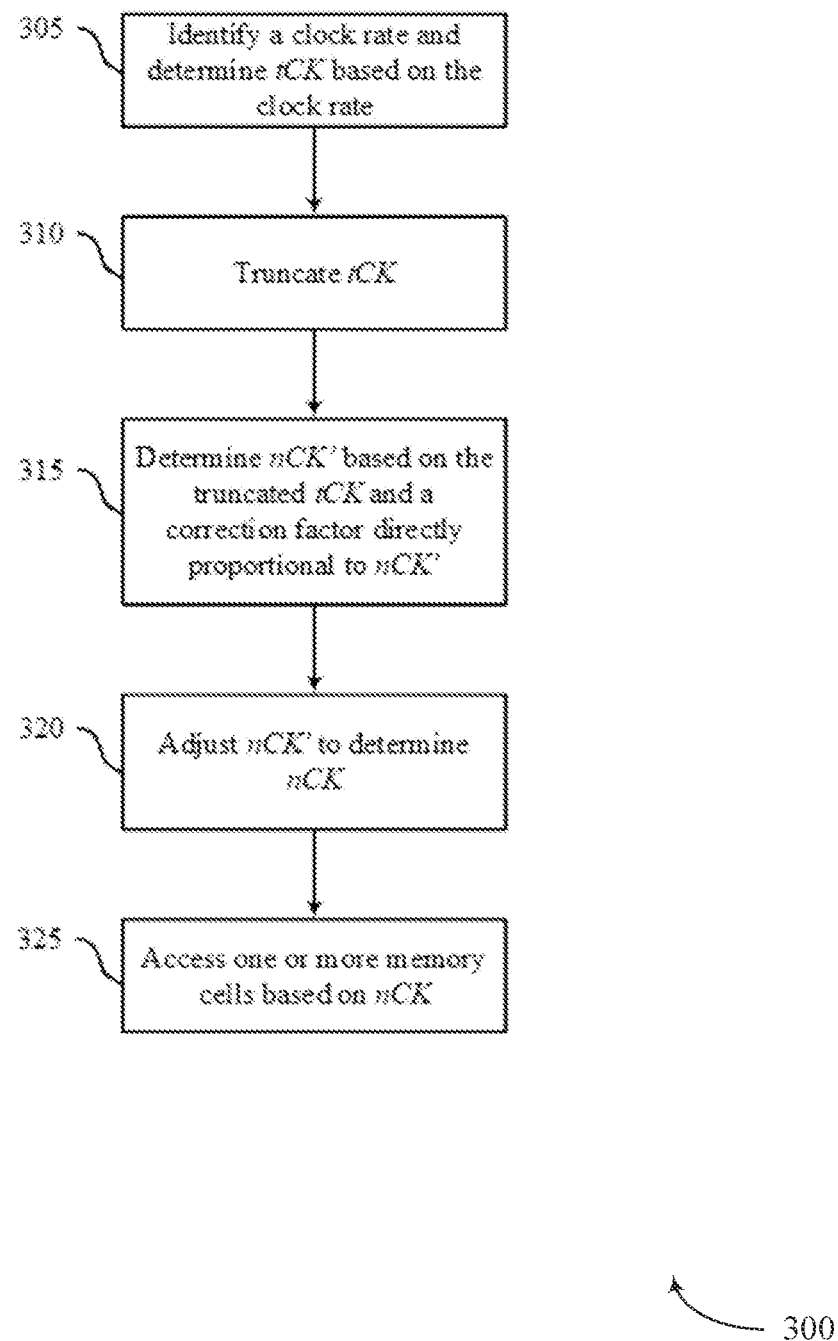
FIG. 3 illustrates an example of a process flow that supports memory clock management and estimation procedures in accordance with examples as disclosed herein.

FIG. 3 illustrates an example of a process flow 300 that supports memory clock management and estimation procedures in accordance with examples as disclosed herein. In some examples, one or more components may perform various aspects of the process flow 200. For instance, an external memory controller (e.g., an external memory controller 120 of a host device 105 as described with reference to FIG. 1), a device memory controller (e.g., a device memory controller 155 as described with reference to FIG. 1) of the memory device, a local memory controller (e.g., a local memory controller 165 as described with reference to FIG. 1), or a combination thereof may perform the methods associated with process flow 300.

As described herein (e.g., with reference to FIG. 1), a host device or a memory device may perform operations using a clock that repeats according to a clock cycle. For instance, the host device or the memory device may identify a duration (e.g., as stored on an SPD of the memory device) associated with accessing one or more memory cells of a memory array (e.g., a write recovery delay, a row address to column address delay) and may determine a quantity of clock cycles that corresponds to the identified duration. The methods as described herein (e.g., with reference to FIG. 3) may enable a host device or a memory device to determine the quantity of clock cycles that corresponds to the identified duration. The methods of FIG. 3 may differ from those of FIG. 2 in that the quantity of clock cycles may be rounded up according to the methods FIG. 3 whereas the quantity of clock cycles may be truncated according to the methods of FIG. 2. Additionally, the methods of FIG. 2 may include using two correction factors, whereas the methods of FIG. 3 may include using a single correction factor.

At 305, the host device or the memory device may identify a clock rate (e.g., a clock rate of the host device that is compatible with a clock rate indicated by a register, such as an SPD, or one or more memory cells of the memory device) and may determine the value of a first parameter associated with a first duration for a clock to perform a clock cycle (e.g., tCK(AVG)real), which may be an example of a real application memory clock period) based on the clock rate. For instance, the value of the first parameter may be an inverse of a value of the clock rate. In some examples, the host device or the memory device may identify the clock rate based on receiving a request (e.g., from a host device) to adjust to the clock rate. Additionally or alternatively, the host device or the memory device may identify a condition at the host device or the memory device and may adjust the clock rate based on the condition.

At 310, the host device or the memory device may truncate the value of the first parameter. For instance, the host device or the memory device may perform truncate (tCK(AVG)). In some examples, the host device or the memory device may truncate the first parameter to a particular granularity (e.g., to the picosecond level).

At 315, the host device or the memory device may determine a second parameter (e.g., nCK') based on the truncated value of the first parameter (e.g., truncate(tCK (AVG)real)) and a first correction factor (e.g., correction_factor). For instance, the second parameter may be inversely proportional to the truncated value of the first parameter and directly proportional the first correction factor. In some examples, the second parameter may be directly proportional to a third parameter (e.g., truncate (parameter_nominal)) associated with accessing the one or more memory cells of the memory array. In some examples, the third parameter may be determined based on truncating a fourth parameter (e.g., parameter_nominal). The second parameter may be determined as:

$$nCK' = \frac{\text{truncate}(\text{parameter\_nominal}) * \text{correction\_factor}}{\text{truncate}(tCK(AVG)\text{real})}.$$

In some examples, the correction factor may include or be an example of a factor by which the second parameter is corrected. In some examples, for a write recovery delay, parameter_nominal may equal 30 nanoseconds and, for a column to column command delay (e.g., tCCD), parameter_nominal may equal 5 nanoseconds. In some examples, correction_factor may be equal to 0.997. In some examples, parameter_nominal and tCK(AVG)real may not be truncated prior to determination of the second parameter (e.g., nCK').

At 320, the host device or the memory device may determine a quantity of clock cycles (e.g., nCK) associated with a second duration for accessing one or more memory cells of the memory array based on adjusting the second parameter. For instance, the host device or the memory device may adjust, based on estimating the value of the second parameter, the third parameter from a first value to a second value higher than the first value. Additionally or alternatively, the host device or the memory device may quantize (e.g., perform a ceiling operation on) the first value of the third parameter based on estimating the value of the second parameter. The host device or the memory device may determine the quantity of clock cycles as: nCK=ceiling (nCK'). In some examples, the second duration may correspond to a write recovery delay (e.g., tWRmin) or a row address to column address delay (e.g., tRCDmin).

At 325, the host device or the memory device may access the one or more memory cells of the memory array based on the determined quantity of clock cycles. For instance, the host device or the memory device may employ a delay (e.g., tWRmin, tRCDmin) while performing an access operation, such as a read, a write, an activate, or a precharge, on the one or more cells according to the determined quantity of clock cycles.

A host device or a memory device implementing the methods as described herein (e.g., with reference to FIG. 3) may be associated with one or more advantages. For instance, determining a quantity of clock cycles based on a ratio directly proportional to a correction factor may more often yield the quantity of clock cycles closest in time to a desired duration than determining the quantity of clock cycles based on a ratio that is not proportional to a correction factor. Accordingly, a host device or a memory device determining the quantity of clock cycles based on the ratio directly proportional to the correction factor may more accurately perform a memory access procedure over a host device or a memory device that determines the quantity of clock cycles based on a ratio that is not proportional to the correction factor.

Figure 4:
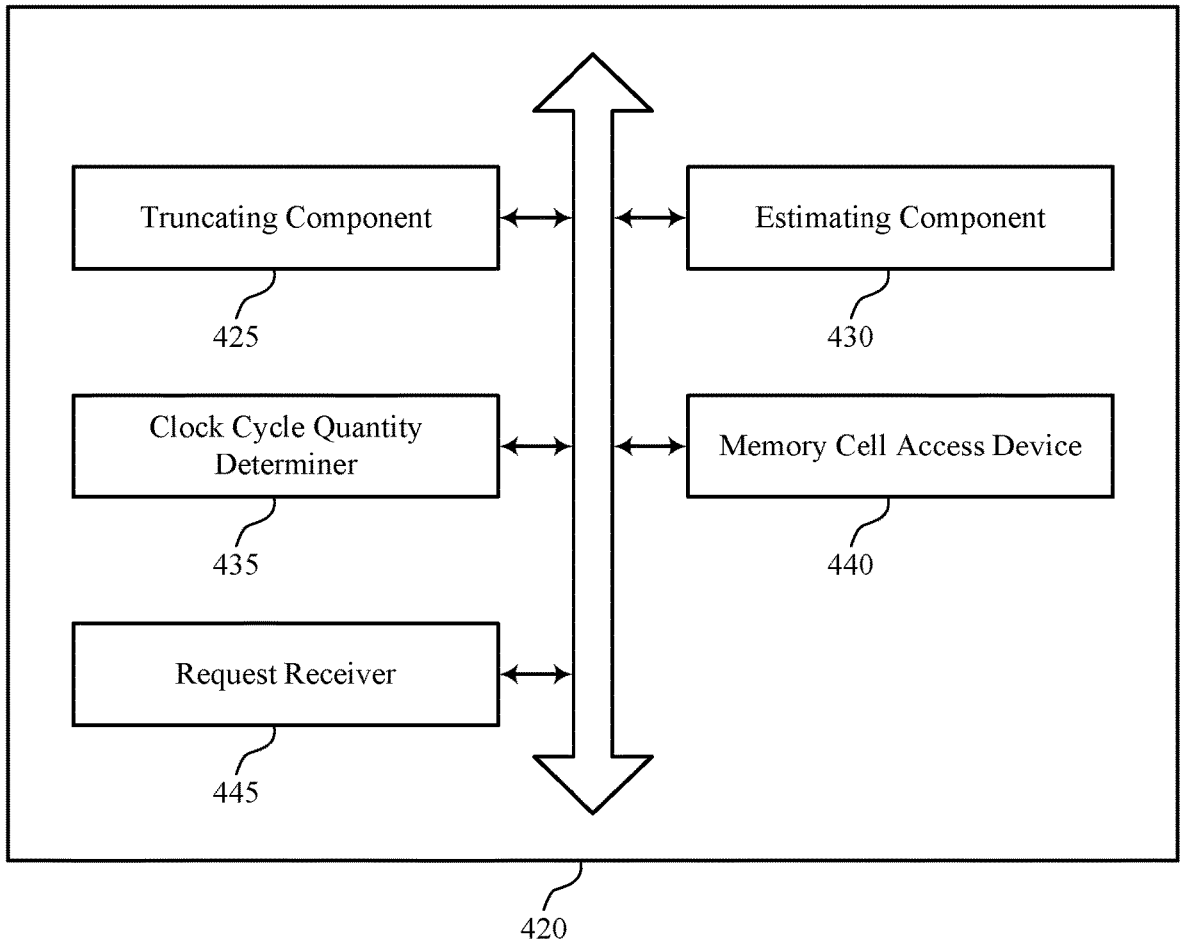
FIG. 4 shows a block diagram of a memory device that supports memory clock management and estimation procedures in accordance with examples as disclosed herein.

FIG. 4 shows a block diagram 400 of a device 420 that supports memory clock management and estimation procedures in accordance with examples as disclosed herein. The device 420 may be an example of aspects of a memory device, a host device, or both as described with reference to FIGS. 1 through 3. The device 420, or various components thereof, may be an example of means for performing various aspects of memory clock management and estimation procedures as described herein. For example, the device 420 may include a truncating component 425, an estimating component 430, a clock cycle quantity determiner 435, a memory cell access device 440, a request receiver 445, or any combination thereof. Each of these components may communicate, directly or indirectly, with one another (e.g., via one or more buses).

The truncating component 425 may be configured as or otherwise support a means for truncating a value of a first parameter associated with a first duration for a clock to perform a clock cycle. The estimating component 430 may be configured as or otherwise support a means for estimating a value of a second parameter that is inversely proportional to the truncated value of the first parameter and directly proportional to a correction factor. The clock cycle quantity determiner 435 may be configured as or otherwise support a means for determining a quantity of clock cycles associated with a second duration for accessing one or more memory cells of a memory array based at least in part on adjusting a third parameter associated with the second parameter. The memory cell access device 440 may be configured as or otherwise support a means for accessing the one or more memory cells of the memory array based at least in part on the determined quantity of clock cycles.

In some examples, the request receiver 445 may be configured as or otherwise support a means for receiving a request to adjust a clock rate of the clock, where truncating the value of the first parameter is based at least in part on receiving the request.

In some examples, the clock cycle quantity determiner 435 may be configured as or otherwise support a means for adjusting, based at least in part on estimating the value of the second parameter, the third parameter from a first value to a second value lower than the first value, and where determining the quantity of clock cycles is based at least in part on adjusting the third parameter from the first value to the second value.

In some examples, the clock cycle quantity determiner 435 may be configured as or otherwise support a means for truncating the first value of the third parameter based at least in part on estimating the value of the second parameter, where adjusting the third parameter from the first value to the second value is based at least in part on truncating the first value of the third parameter.

In some examples, the clock cycle quantity determiner 435 may be configured as or otherwise support a means for determining the third parameter based at least in part on combining the second parameter and a second correction factor, where adjusting the third parameter is based at least in part on determining the third parameter.

In some examples, the second parameter is directly proportional to a fourth parameter associated with accessing the one or more memory cells of the memory array.

In some examples, the estimating component 430 may be configured as or otherwise support a means for determining the fourth parameter based at least in part on truncating a fifth parameter.

In some examples, the second duration for accessing the one or more memory cells corresponds to a write recovery delay or a row address to column address delay.

In some examples, the correction factor includes a factor by which the second parameter is corrected.

In some examples, the truncating component 425 may be configured as or otherwise support a means for truncating a value of a first parameter associated with a first duration for a clock to perform a clock cycle. In some examples, the clock cycle quantity determiner 435 may be configured as or otherwise support a means for determining a quantity of clock cycles associated with a second duration for accessing one or more memory cells of a memory array based at least in part on adjusting a second parameter that is inversely proportional to the truncated value of the first parameter and directly proportional to a correction factor. In some examples, the memory cell access device 440 may be configured as or otherwise support a means for accessing the one or more memory cells of the memory array based at least in part on the determined quantity of clock cycles.

In some examples, the request receiver 445 may be configured as or otherwise support a means for receiving a request to adjust a clock rate of the clock, where truncating the value of the first parameter is based at least in part on receiving the request.

In some examples, the clock cycle quantity determiner 435 may be configured as or otherwise support a means for adjusting, based at least in part on truncating the value of the first parameter, the second parameter from a first value to a second value higher than the first value, and where determining the quantity of clock cycles is based at least in part on adjusting the second parameter from the first value to the second value.

In some examples, the clock cycle quantity determiner 435 may be configured as or otherwise support a means for quantizing (e.g., performing a ceiling operation on) the second parameter based at least in part on truncating the value of the first parameter, where adjusting the second parameter from the first value to the second value is based at least in part on quantizing the second parameter.

In some examples, the second parameter is directly proportional to a third parameter associated with accessing the one or more memory cells of the memory array.

In some examples, the second duration for accessing the one or more memory cells of the memory array corresponds to a write recovery delay or a row address to column address delay.

In some examples, the correction factor includes a factor by which the second parameter is corrected.

Figure 5:
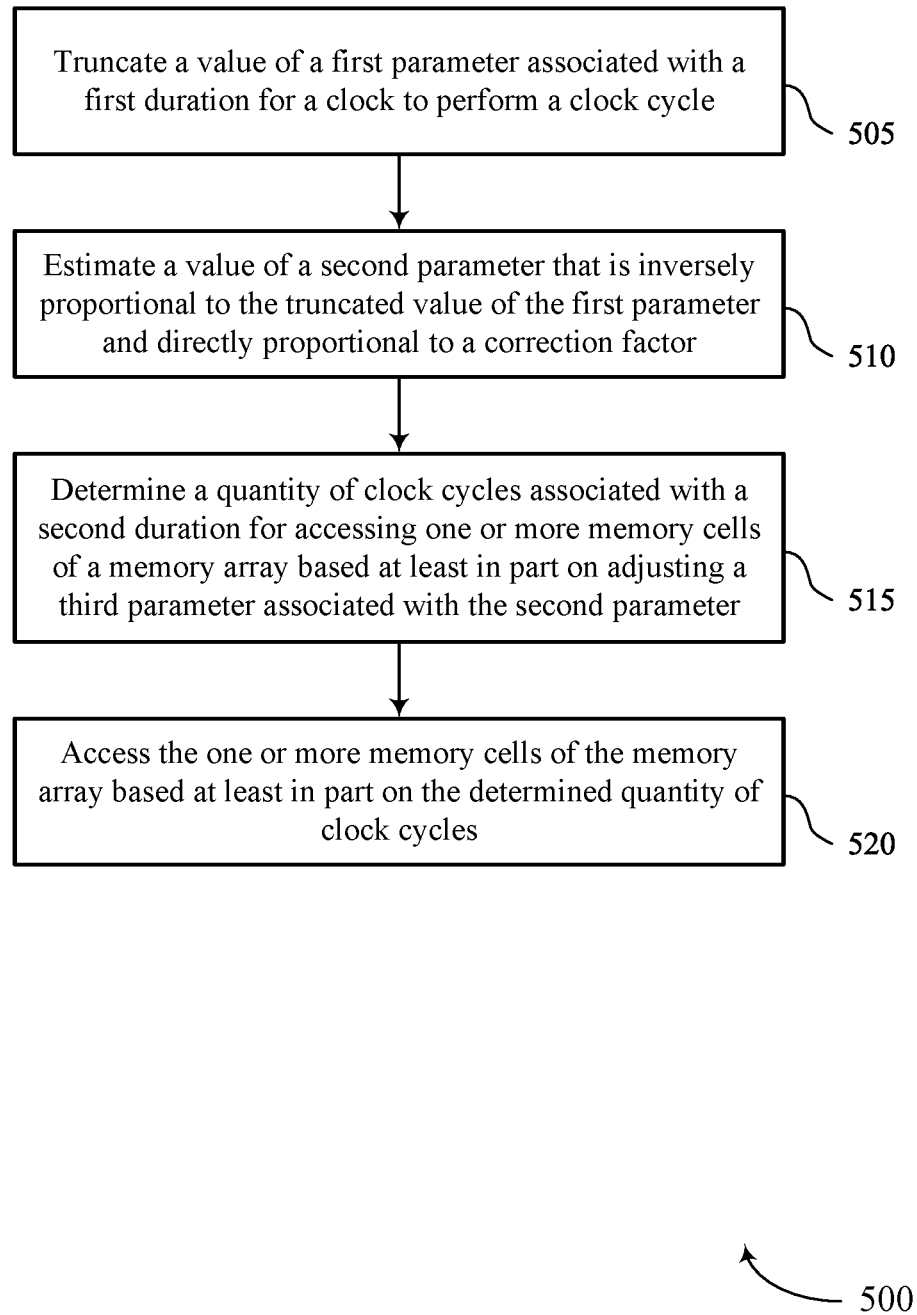
FIGS. 5 and 6 show flowcharts illustrating a method or methods that support memory clock management and estimation procedures in accordance with examples as disclosed herein.

FIG. 5 shows a flowchart illustrating a method 500 that supports memory clock management and estimation procedures in accordance with examples as disclosed herein. The operations of method 500 may be implemented by a memory device, a host device, or their components as described herein. For example, the operations of method 500 may be performed by a memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 505, the method may include truncating a value of a first parameter associated with a first duration for a clock to perform a clock cycle. The operations of 505 may be performed in accordance with examples as disclosed herein. In some examples, aspects of the operations of 505 may be performed by a truncating component 425 as described with reference to FIG. 4.

At 510, the method may include estimating a value of a second parameter that is inversely proportional to the truncated value of the first parameter and directly proportional to a correction factor. The operations of 510 may be performed in accordance with examples as disclosed herein. In some examples, aspects of the operations of 510 may be performed by an estimating component 430 as described with reference to FIG. 4.

At 515, the method may include determining a quantity of clock cycles associated with a second duration for accessing one or more memory cells of a memory array based at least in part on adjusting a third parameter associated with the second parameter. The operations of 515 may be performed in accordance with examples as disclosed herein. In some examples, aspects of the operations of 515 may be performed by a clock cycle quantity determiner 435 as described with reference to FIG. 4.

At 520, the method may include accessing the one or more memory cells of the memory array based at least in part on the determined quantity of clock cycles. The operations of 520 may be performed in accordance with examples as disclosed herein. In some examples, aspects of the operations of 520 may be performed by a memory cell access device 440 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for truncating a value of a first parameter associated with a first duration for a clock to perform a clock cycle, estimating a value of a second parameter that is inversely proportional to the truncated value of the first parameter and directly proportional to a correction factor, determining a quantity of clock cycles associated with a second duration for accessing one or more memory cells of a memory array based at least in part on adjusting a third parameter associated with the second parameter, and accessing the one or more memory cells of the memory array based at least in part on the determined quantity of clock cycles.

Some examples of the method 500 and the apparatus described herein may further include operations, features, circuitry, logic, means, or instructions for receiving a request to adjust a clock rate of the clock, where truncating the value of the first parameter may be based at least in part on receiving the request.

In some examples of the method 500 and the apparatus described herein, adjusting, based at least in part on estimating the value of the second parameter, the third parameter from a first value to a second value lower than the first value, and where determining the quantity of clock cycles may be based at least in part on adjusting the third parameter from the first value to the second value.

Some examples of the method 500 and the apparatus described herein may further include operations, features, circuitry, logic, means, or instructions for truncating the first value of the third parameter based at least in part on estimating the value of the second parameter, where adjusting the third parameter from the first value to the second value may be based at least in part on truncating the first value of the third parameter.

Some examples of the method 500 and the apparatus described herein may further include operations, features, circuitry, logic, means, or instructions for determining the third parameter based at least in part on combining the second parameter and a second correction factor, where adjusting the third parameter may be based at least in part on determining the third parameter.

In some examples of the method 500 and the apparatus described herein, the second parameter may be directly proportional to a fourth parameter associated with accessing the one or more memory cells of the memory array.

Some examples of the method 500 and the apparatus described herein may further include operations, features, circuitry, logic, means, or instructions for determining the fourth parameter based at least in part on truncating a fifth parameter.

In some examples of the method 500 and the apparatus described herein, the second duration for accessing the one or more memory cells corresponds to a write recovery delay or a row address to column address delay.

In some examples of the method 500 and the apparatus described herein, the correction factor includes a factor by which the second parameter may be corrected.

Figure 6:
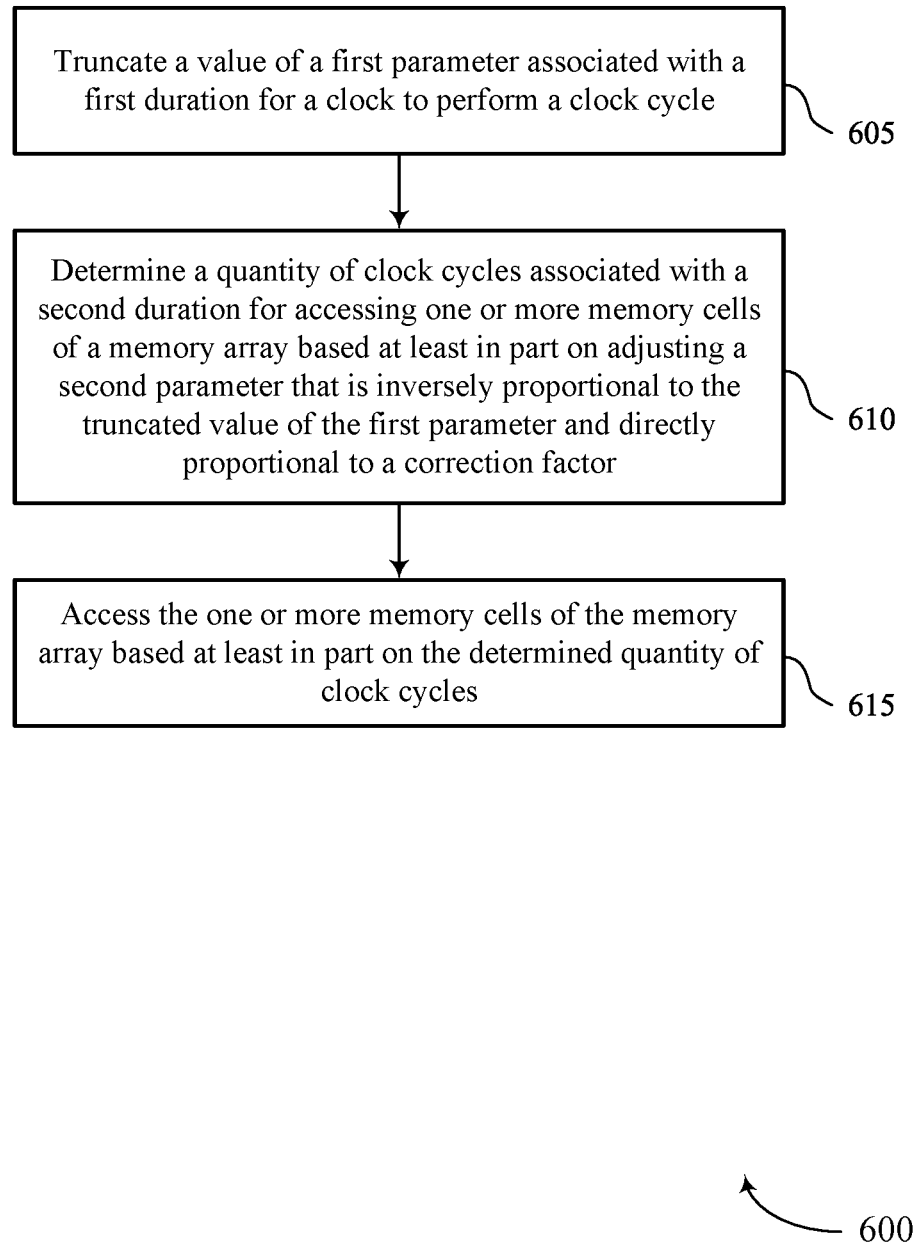

FIG. 6 shows a flowchart illustrating a method 600 that supports memory clock management and estimation procedures in accordance with examples as disclosed herein. The operations of method 600 may be implemented by a host device, a memory device, or their components as described herein. For example, the operations of method 600 may be performed by a memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 605, the method may include truncating a value of a first parameter associated with a first duration for a clock to perform a clock cycle. The operations of 605 may be performed in accordance with examples as disclosed herein. In some examples, aspects of the operations of 605 may be performed by a truncating component 425 as described with reference to FIG. 4.

At 610, the method may include determining a quantity of clock cycles associated with a second duration for accessing one or more memory cells of a memory array based at least in part on adjusting a second parameter that is inversely proportional to the truncated value of the first parameter and directly proportional to a correction factor. The operations of 610 may be performed in accordance with examples as disclosed herein. In some examples, aspects of the operations of 610 may be performed by a clock cycle quantity determiner 435 as described with reference to FIG. 4.

At 615, the method may include accessing the one or more memory cells of the memory array based at least in part on the determined quantity of clock cycles. The operations of 615 may be performed in accordance with examples as disclosed herein. In some examples, aspects of the operations of 615 may be performed by a memory cell access device 440 as described with reference to FIG. 4.

In some examples, an apparatus as described herein may perform a method or methods, such as the method 600. The apparatus may include, features, circuitry, logic, means, or instructions (e.g., a non-transitory computer-readable medium storing instructions executable by a processor) for truncating a value of a first parameter associated with a first duration for a clock to perform a clock cycle, determining a quantity of clock cycles associated with a second duration for accessing one or more memory cells of a memory array based at least in part on adjusting a second parameter that is inversely proportional to the truncated value of the first parameter and directly proportional to a correction factor, and accessing the one or more memory cells of the memory array based at least in part on the determined quantity of clock cycles.

Some examples of the method 600 and the apparatus described herein may further include operations, features, circuitry, logic, means, or instructions for receiving a request to adjust a clock rate of the clock, where truncating the value of the first parameter may be based at least in part on receiving the request.

In some examples of the method 600 and the apparatus described herein, adjusting, based at least in part on truncating the value of the first parameter, the second parameter from a first value to a second value higher than the first value, and where determining the quantity of clock cycles may be based at least in part on adjusting the second parameter from the first value to the second value.

Some examples of the method 600 and the apparatus described herein may further include operations, features, circuitry, logic, means, or instructions for quantizing the second parameter based at least in part on truncating the value of the first parameter, where adjusting the second parameter from the first value to the second value may be based at least in part on quantizing the second parameter.

In some examples of the method 600 and the apparatus described herein, the second parameter may be directly proportional to a third parameter associated with accessing the one or more memory cells of the memory array.

In some examples of the method 600 and the apparatus described herein, the second duration for accessing the one or more memory cells of the memory array corresponds to a write recovery delay or a row address to column address delay.

In some examples of the method 600 and the apparatus described herein, the correction factor includes a factor by which the second parameter may be corrected.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a circuit configured to cause the apparatus to: truncate a value of a first parameter associated with a first duration for a clock to perform a clock cycle, estimate a value of a second parameter that is inversely proportional to the truncated value of the first parameter and directly proportional to a correction factor, determine a quantity of clock cycles associated with a second duration for accessing one or more memory cells of a memory array based at least in part on adjusting a third parameter associated with the second parameter, and access the one or more memory cells of the memory array based at least in part on the determined quantity of clock cycles.

In some examples, the circuit may be further configured to cause the apparatus to receive a request to adjust a clock rate of the clock, where truncating the value of the first parameter may be based at least in part on receiving the request.

In some examples of the apparatus, the circuit may be further configured to cause the apparatus to adjust, based at least in part on estimating the value of the second parameter, the third parameter from a first value to a second value, where the second value may be lower than the first value, and where determining the quantity of clock cycles may be based at least in part on adjusting the third parameter from the first value to the second value.

In some examples, the circuit may be further configured to cause the apparatus to truncate the third parameter based at least in part on estimating the value of the second parameter, where adjusting the third parameter from the first value to the second value may be based at least in part on truncating the third parameter.

In some examples, the circuit may be further configured to cause the apparatus to determine the third parameter based at least in part on combining the second parameter and a second correction factor, where adjusting the third parameter may be based at least in part on determining the third parameter.

In some examples of the apparatus, the second parameter may be directly proportional to a fourth parameter associated with accessing the one or more memory cells of the memory array.

In some examples, the circuit may be further configured to cause the apparatus to determine the fourth parameter based at least in part on truncating a fifth parameter.

In some examples of the apparatus, the second duration for accessing the one or more memory cells corresponds to a write recovery delay or a row address to column address delay.

In some examples of the apparatus, the correction factor includes a factor by which the second parameter may be corrected.

Another apparatus is described. The apparatus may include a circuit configured to cause the apparatus to: truncate a value of a first parameter associated with a first duration for a clock to perform a clock cycle, determine a quantity of clock cycles associated with a second duration for accessing one or more memory cells of a memory array based at least in part on adjusting a second parameter that is inversely proportional to the truncated value of the first parameter and directly proportional to a correction factor, and access the one or more memory cells of the memory array based at least in part on the determined quantity of clock cycles In some examples, the circuit may be further configured to cause the apparatus to receive a request to adjust a clock rate of the clock, where truncating the value of the first parameter may be based at least in part on receiving the request.

In some examples of the apparatus, the circuit may be further configured to cause the apparatus to adjust, based at least in part on truncating the value of the first parameter, the second parameter from a first value to a second value, where the second value may be higher than the first value, and where determining the quantity of clock cycles may be based at least in part on adjusting the second parameter from the first value to the second value.

In some examples of the apparatus, the circuit may be further configured to cause the apparatus to quantize, based at least in part on truncating the value of the first parameter, the second parameter, where adjusting the second parameter from the first value to the second value may be based at least in part on quantizing the second parameter.

In some examples of the apparatus, the second parameter may be directly proportional to a third parameter associated with accessing the one or more memory cells of the memory array.

In some examples of the apparatus, the second duration for accessing the one or more memory cells of the memory array corresponds to a write recovery delay or a row address to column address delay.

In some examples of the apparatus, the correction factor includes a factor by which the second parameter may be corrected.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent each of the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    truncating a value of a first parameter associated with a first duration for a clock to perform a clock cycle;
    estimating a value of a second parameter that is inversely proportional to the truncated value of the first parameter and directly proportional to a correction factor;
    determining a quantity of clock cycles associated with a second duration for accessing one or more memory cells of a memory array based at least in part on adjusting a third parameter associated with the second parameter; and
    accessing the one or more memory cells of the memory array based at least in part on the determined quantity of clock cycles.

2. The method of claim 1, further comprising:
    receiving a request to adjust a clock rate of the clock, wherein truncating the value of the first parameter is based at least in part on receiving the request.

3. The method of claim 1, further comprising:
    adjusting, based at least in part on estimating the value of the second parameter, the third parameter from a first value to a second value lower than the first value, and wherein determining the quantity of clock cycles is based at least in part on adjusting the third parameter from the first value to the second value.

4. The method of claim 3, further comprising:
    truncating the first value of the third parameter based at least in part on estimating the value of the second parameter, wherein adjusting the third parameter from the first value to the second value is based at least in part on truncating the first value of the third parameter.

5. The method of claim 1, further comprising:
    determining the third parameter based at least in part on combining the second parameter and a second correction factor, wherein adjusting the third parameter is based at least in part on determining the third parameter.

6. The method of claim 1, wherein the second parameter is directly proportional to a fourth parameter associated with accessing the one or more memory cells of the memory array.

7. The method of claim 6, further comprising:
    determining the fourth parameter based at least in part on truncating a fifth parameter.

8. The method of claim 1, wherein the second duration for accessing the one or more memory cells corresponds to a write recovery delay or a row address to column address delay.

9. The method of claim 1, wherein the correction factor comprises a factor by which the second parameter is corrected.

10. An apparatus, comprising:
    a circuit configured to cause the apparatus to:
    truncate a value of a first parameter associated with a first duration for a clock to perform a clock cycle;
    estimate a value of a second parameter that is inversely proportional to the truncated value of the first parameter and directly proportional to a correction factor;
    determine a quantity of clock cycles associated with a second duration for accessing one or more memory cells of a memory array based at least in part on adjusting a third parameter associated with the second parameter; and
    access the one or more memory cells of the memory array based at least in part on the determined quantity of clock cycles.

11. The apparatus of claim 10, wherein the circuit is further configured to cause the apparatus to:
    receive a request to adjust a clock rate of the clock, wherein truncating the value of the first parameter is based at least in part on receiving the request.

12. The apparatus of claim 10, wherein the circuit is further configured to cause the apparatus to:
    adjust, based at least in part on estimating the value of the second parameter, the third parameter from a first value to a second value, wherein the second value is lower than the first value, and wherein determining the quantity of clock cycles is based at least in part on adjusting the third parameter from the first value to the second value.

13. The apparatus of claim 12, wherein the circuit is further configured to cause the apparatus to:
    truncate the third parameter based at least in part on estimating the value of the second parameter, wherein adjusting the third parameter from the first value to the second value is based at least in part on truncating the third parameter.

14. The apparatus of claim 10, wherein the circuit is further configured to cause the apparatus to:
determine the third parameter based at least in part on combining the second parameter and a second correction factor, wherein adjusting the third parameter is based at least in part on determining the third parameter.

15. The apparatus of claim 10, wherein the second parameter is directly proportional to a fourth parameter associated with accessing the one or more memory cells of the memory array.

16. The apparatus of claim 15, wherein the circuit is further configured to cause the apparatus to:
determine the fourth parameter based at least in part on truncating a fifth parameter.

17. The apparatus of claim 10, wherein the second duration for accessing the one or more memory cells corresponds to a write recovery delay or a row address to column address delay.

18. The apparatus of claim 10, wherein the correction factor comprises a factor by which the second parameter is corrected.

19. A non-transitory computer-readable medium comprising instructions which, when executed by a processor of an electronic device, cause the electronic device to:
truncate a value of a first parameter associated with a first duration for a clock coupled to perform a clock cycle;
estimate a value of a second parameter that is inversely proportional to the truncated value of the first parameter and directly proportional to a correction factor;
determine a quantity of clock cycles associated with a second duration for accessing one or more memory cells of a memory array based at least in part on adjusting a third parameter associated with the second parameter; and
access the one or more memory cells of the memory array based at least in part on the determined quantity of clock cycles.

20. The non-transitory computer-readable medium of claim 19, wherein the instructions, when executed by the processor of the electronic device, further cause the electronic device to:
receive a request to adjust a clock rate of the clock, wherein truncating the value of the first parameter is based at least in part on receiving the request.

21. The non-transitory computer-readable medium of claim 19, wherein the instructions, when executed by the processor of the electronic device, further cause the electronic device to:
adjust, based at least in part on estimating the value of the second parameter, the third parameter from a first value to a second value, wherein the second value is lower than the first value, and wherein determining the quantity of clock cycles is based at least in part on adjusting the third parameter from the first value to the second value.

22. The non-transitory computer-readable medium of claim 21, wherein the instructions, when executed by the processor of the electronic device, further cause the electronic device to:
truncate the third parameter based at least in part on estimating the value of the second parameter, wherein adjusting the third parameter from the first value to the second value is based at least in part on truncating the third parameter.

23. The non-transitory computer-readable medium of claim 19, wherein the instructions, when executed by the processor of the electronic device, further cause the electronic device to:
determine the third parameter based at least in part on combining the second parameter and a second correction factor, wherein adjusting the third parameter is based at least in part on determining the third parameter.

24. The non-transitory computer-readable medium of claim 19, wherein the second duration for accessing the one or more memory cells corresponds to a write recovery delay or a row address to column address delay.

25. The non-transitory computer-readable medium of claim 19, wherein the correction factor comprises a factor by which the second parameter is corrected.

* * * * *